(12) United States Patent
Sambucetti et al.

(10) Patent No.: US 6,573,606 B2
(45) Date of Patent: Jun. 3, 2003

(54) CHIP TO WIRING INTERFACE WITH SINGLE METAL ALLOY LAYER APPLIED TO SURFACE OF COPPER INTERCONNECT

(75) Inventors: Carlos Juan Sambucetti, Croton on Hudson, NY (US); Xiaomeng Chen, Poughkeepsie, NY (US); Soon-Cheon Seo, White Plains, NY (US); Birenda Nath Agarwala, Hopewell Juction, NY (US); Chao-Kun Hu, Somers, NY (US); Naftali Eliahu Lustig, Croton on Hudson, NY (US); Stephen Edward Greco, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/881,444

(22) Filed: Jun. 14, 2001

(65) Prior Publication Data

US 2003/0001275 A1 Jan. 2, 2003

(51) Int. Cl.$^7$ ............................................. H01L 21/44
(52) U.S. Cl. .................. 257/762; 257/750; 257/751; 257/763; 257/764; 257/765; 257/770; 257/771; 438/612; 438/618; 438/633; 438/687
(58) Field of Search ................................ 257/754, 762, 257/765, 767, 770, 771; 438/683, 686, 685, 687, 693, 745, 756, 757, 638, 653, 624, 639, 633

(56) References Cited

U.S. PATENT DOCUMENTS

| | | | | |
|---|---|---|---|---|
| 5,420,072 A | * | 5/1995 | Fiordalice et al. | 437/192 |
| 5,447,887 A | * | 9/1995 | Filipiak et al. | 437/200 |
| 5,674,787 A | * | 10/1997 | Zhao et al. | 437/230 |
| 5,695,810 A | * | 12/1997 | Dubin et al. | 427/96 |
| 5,783,483 A | * | 7/1998 | Gardner | 438/627 |
| 5,824,599 A | * | 10/1998 | Schacham-Diamand et al. | 438/678 |
| 6,023,100 A | * | 2/2000 | Tao et al. | 257/762 |
| 6,228,770 B1 | * | 5/2001 | Pradeep et al. | 438/692 |
| 6,274,932 B1 | * | 8/2001 | Mikagi | 257/754 |
| 6,352,917 B1 | * | 3/2002 | Gupta et al. | 438/622 |
| 2002/0036143 A1 | * | 3/2002 | Segawa et al. | 205/187 |

OTHER PUBLICATIONS

Hu et al. "Reduced Electromigration and Stress Induced Migration of Cu Wires by Surface Coating" U.S. patent application Ser. No. 09/361,573 Filed Jul. 27, 1999.

Rubino et al. "Method for Forming Dual–Layer Low Dielectric Barrier for InterConnects and Device Formed", U.S. patent application Ser. No. 09/510,259 Filed Feb. 22, 2000.

* cited by examiner

Primary Examiner—Nathan J. Flynn
Assistant Examiner—Fazli Erdem
(74) Attorney, Agent, or Firm—Daniel P. Morris; Alvin J. Riddles

(57) ABSTRACT

In the invention an electrically isolated copper interconnect structural interface is provided involving a single, about 50–300 A thick, alloy capping layer, that controls diffusion and electromigration of the interconnection components and reduces the overall effective dielectric constant of the interconnect; the capping layer being surrounded by a material referred to in the art as hard mask material that can provide a resist for subsequent reactive ion etching operations, and there is also provided the interdependent process steps involving electroless deposition in the fabrication of the structural interface. The single layer alloy metal barrier in the invention is an alloy of the general type A—X—Y, where A is a metal taken from the group of cobalt (Co) and nickel (Ni), X is a member taken from the group of tungsten (W), tin (Sn), and silicon (Si), and Y is a member taken from the group of phosphorous (P) and boron (B); having a thickness in the range of 50 to 300 Angstroms.

8 Claims, 3 Drawing Sheets

ELECTROMIGRATION

CHIP TO WIRING INTERFACE WITH SINGLE METAL ALLOY LAYER APPLIED TO SURFACE OF COPPER INTERCONNECT

FIELD OF THE INVENTION

The invention is directed to integrated circuit chips and wiring interconnect structures involving the metal copper, known as back end of the line (BEOL) structures, and in particular to a structure and process of forming an interface with a thin single alloy layer on copper interconnect metal in a semiconductor device that provides improved adhesion to subsequent deposited layers, protection against copper diffusion and resistance to electromigration and a lower interconnect dielectric constant.

BACKGROUND

In the fabrication of chip network circuitry involving the metal copper, interconnected to the vias and trenches of the network, those vias and trenches have been interconnected heretofore in the art through metalization type processes utilizing standard sequential procedures of thick dielectric deposition of such materials as SiO2 or low dielectric constant (K) materials, hardmask deposition, via and trench opening formation, deposition of thin liner film on via and trench walls, filling vias and trenches with copper metal, planarization of the top copper surface, and finally capping the top surface of the planarized copper with protective dielectric layers for preventing copper migration into the next upper dielectric layer which is usually of SiO2, Si3N4, or a capping type arrangement such as a multiple layer structure known in the art as BLOK, or other low dielectric constant (K) material, and, for minimizing interactions with the copper while the upper dielectric layer is deposited and processed. The final capping layer, further then can serve as a reactive ion etch stop layer for patterning a next upper dielectric layer. This procedure has come to be known in the art as "the integration scheme for Cu-BEOL". The process is repeated for each subsequent level of the interconnect wiring. Heretofore in the art the capping layer has been quite thick and has resulted in excessive dielectric loss.

Thus far in the art, in chip network interconnections employing the metal copper, there have been interdependent considerations resulting from the possible electromigration of the copper and the adhesion properties of any layer that serves a capping function in the overall process and the thickness and properties of any capping layer on the dielectric constant of the interconnect. There has been some progress in the art heretofore.

In patent application Ser. No. 09/510,259, Filed Feb. 22, 2000, assigned to the assignee of this application, there is described a sequence of processes for forming dual protective layers made up of a bilayer metal cap/insulator (known as a BLOK layer in the art) that is positioned on the surface of Cu conductors of semiconductor devices to protect the Cu surface and to provide improved adhesion and reliability as layers are processed.

In patent application Ser. No. 09/361,573, Filed Jul. 27, 1999, assigned to the assignee of this application efforts in the control of electromigration through the control of the Cu/dielectric interface are advanced through using deposited surface films. There is a need in the art for capping layer, inter layer diffusion, adhesion and electromigration while maintaining high performance and reliability.

SUMMARY OF THE INVENTION

In the invention an electrically isolated copper interconnect structural interface is provided involving a single, about 50–300 Å thick, alloy capping layer, that controls diffusion and electromigration of the interconnection components and reduces the overall effective dielectric constant of the interconnect; the capping layer being surrounded by a material referred to in the art as hard mask material that provides a resist for subsequent reactive ion etching operations, and there is also provided the interdependent process steps in the fabrication of the structural interface. The single layer alloy metal barrier in the invention is an alloy of the general type A—X—Y, where A is a metal taken from the group of cobalt (Co) and nickel (Ni), X is a member taken from the group of tungsten (W), tin (Sn), and silicon (Si), and Y is a member taken from the group of phosphorous (P) and boron (B); having a thickness in the range of 50 to 300 Angstroms with a preferable range being 50 to 75 Angstroms.

DESCRIPTION OF THE INVENTION

Figure 1:
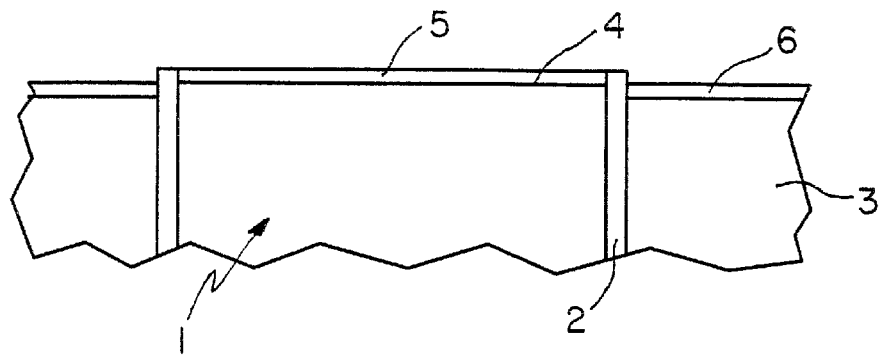
FIG. 1 is a cross sectional depiction of the copper interconnect interface of the invention.

Referring to FIG. 1, the interface of the invention includes a copper interconnect member 1 separated by an electrically isolating liner 2 such as SiO2, from a surrounding dielectric member 3 of for example SiO2 or a material in the art known as SILK The interface further provides, on the exposed face 4 of the copper member 1, an alloy barrier and capping single layer 5 with the surface of the dielectric 3 being covered wit a layer 6 of hard mask type etch stop material. The interface may be employed at each level of a multilevel integrated structure. It has been found, in accordance with the invention, that a single layer 5, of an alloy of the A—X—Y type, where the ingredient A is a member of the group of Co and Ni, the ingredient X is a member of the group of W, Sn and Si, and the ingredient Y is a member of the group of P and B; in contact with the surface 4 of the copper interconnect 1, with a thickness in the range of 50–300 Angstroms, with 50–75 Angstroms being preferred; and surrounded with a hard mask type material layer 6 of for example Si3N4 or the material in the art known as BLOK positioned on the copper 1. The interface of the invention which may be used at level transitions in multilevel interconnecting vias provides an interconnect with improved electrical properties as measured through reduced dielectric constant; reduced electromigration and diffusion. Further, processing control is achieved through the reactive ion etch stopping properties of the hard mask type material layer 6.

Figure 2:
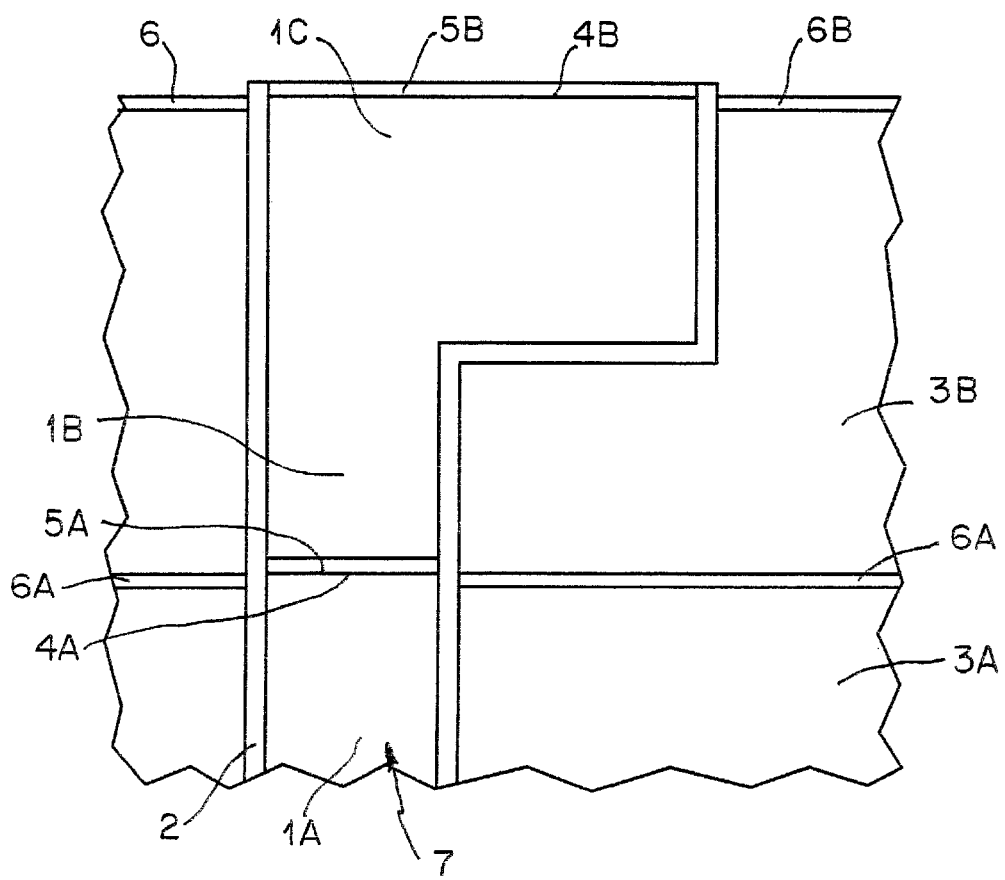
FIG. 2 is a cross sectional view of a damascene type structure in the art illustrating the interface of the invention at different structural levels

Referring to FIG. 2, the flexibility of the interface of the invention, in balancing the conflicting aspects of ingredient properties and processing performance, in producing an improved electrical performance interconnecting contact, is illustrated in connection with an interconnection structure of the type known in the art as dual damascene, wherein the copper portion of the interconnect undergoes cross sectional changes. In FIG. 2, wherein the reference numeral system of the previous figure is continued, the interconnect structure is described as formed in a general fabrication order in which the copper member 1 has portions 1A, 1B and 1C in an opening within liners 2 through dielectric 3 in a preprocessed substrate 7. In the interconnecting member there is a first surface 4A of the copper member portion 1A that is covered by a first single alloy layer 5A within the liners 2 surrounded by a first hard mask material layer 6A; further in the interconnecting member there is a second portion 1B of the copper member 1 that changes in cross sectional area for wiring accommodation in the damascene structure; and still further, the copper member 1 terminates with portion IC at surface 4B on which is positioned single alloy layer 5B surrounded by the hard mask layer 6B which hard mask layer can perform as the stop layer in a Reactive Ion Etch (RIE) type further process step.

The interface and interconnecting structure of FIGS. 1 and 2 provides electrical performance improvements in the form of reduction of the effective dielectric constant of the interconnects; the control of electromigration of the materials and the control of copper diffusion.

The control of copper diffusion is illustrated in connection with FIG. 3 and the control of electromigration is illustrated in connection with FIG. 4.

Improvement in the reduction of the effective dielectric constant of the interconnects is shown in connection with Table 1 following; which is considered to illustrate the data obtained in the values of the effective dielectric constant of stacked via type interconnect structures with and without a capping layer of the material BLOK.

TABLE 1

REDUCTION OF Keff USING THIN SINGLE ALLOY CAP

| STACK | WITH BLOK CAP | WITHOUT BLOK CAP |
|---|---|---|
| HARD MASK (always needed as etch stop) | 300 A°BLOK | 300°A BLOK |
| CAP | BLOK + CoWP | CoWP only |
| K eff | 3.00 | 2.73 |

There is thus indicated that there is a 5.8% reduction in effective dielectric constant in an integrated array with interconnections of the invention having a thin single alloy capping layer.

Figure 3:
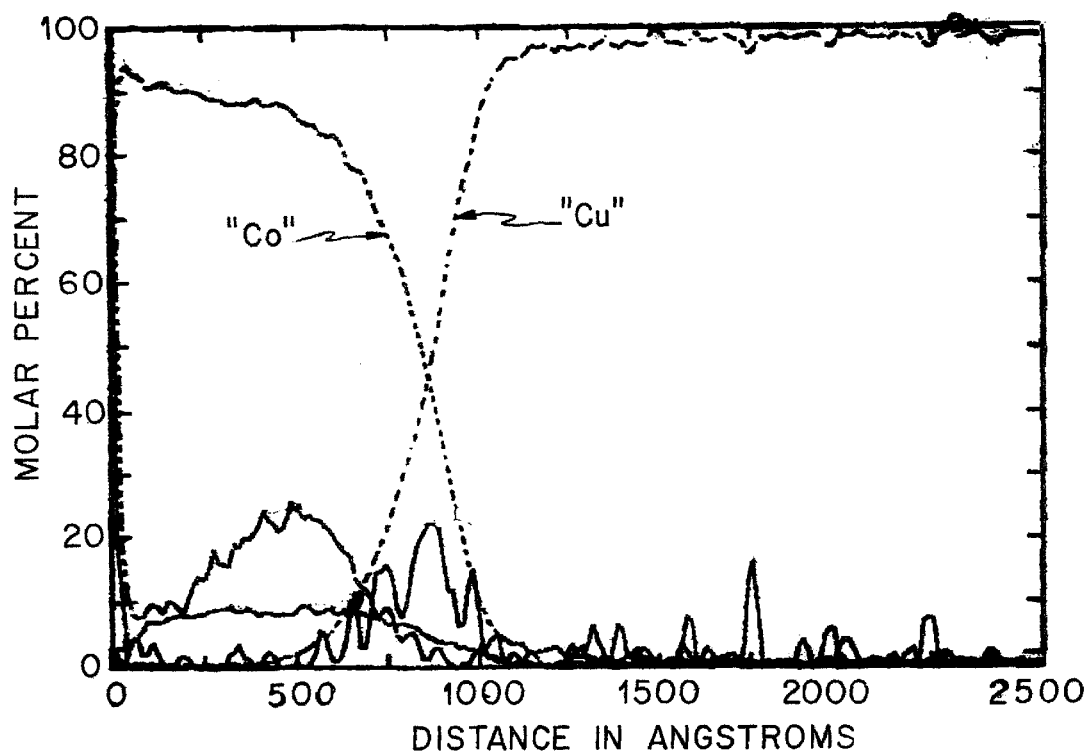
FIG. 3 is an Auger Electron Spectroscopy (AES) depth profile illustrating the barrier benefits and the diffusion prevention properties of a capping layer of the invention such as CoWP.
Figure 4:
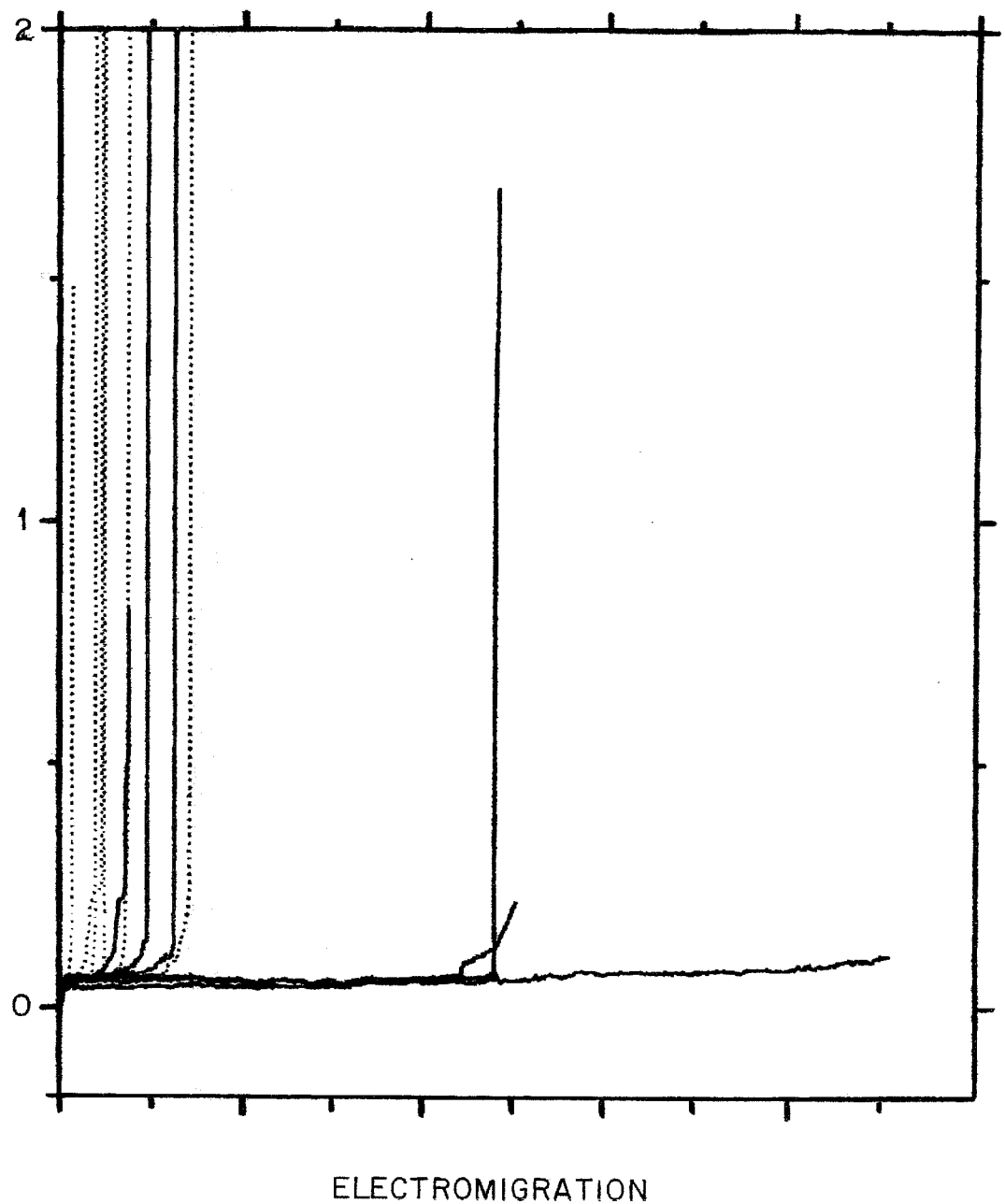
FIG. 4 is a graph illustrating the effect of the invention on electromigration properties of a capping layer of the invention such as CoWP.

The interface and interconnecting structure of FIGS. 1 and 2 provides the control of diffusion of the materials as shown in connection with FIG. 3 which is a graph illustrating the diffusion that takes place in structures employing the invention. Referring to FIG. 3 involving an Auger Electron Spectroscopy (AES) depth profile illustrating the barrier benefits There is illustrated the diffusion prevention properties of the single alloy layer, element 5 in FIGS. 1 and 2, in this instance of a 100 A thickness of CoWP as an example diffusion barrier on copper. The Cobalt signal is labelled "Co" and the Copper signal is labelled "Cu" in FIG. 3. The graph illustrates that the capping layer of the invention provides a diffusion barrier that causes the Cu signal to approach zero within 50 nanometers of the Co film.

The thin alloy capping layer 5 in FIGS. 1 and 2 is effective in providing a barrier to electromigration. In FIG. 4 a graph is provided illustrating the effect of the invention on electromigration properties of an example 100 Angstrom thick alloy CoWP capping layer. Referring to FIG. 4, the graph is considered to be showing that there is increased resistance to electromigration imparted to the structure of the invention by the applying of the 100 A thickness single alloy layer of CoWP on the copper surface at a temperature of 249 degrees C. at a current of 1 mA. In the graph the dotted lines represent interconnects not having the CoWP layer whereas the solid lines represent similar structures with the single CoWP, 100 A thickness layer. The data along the abcissa scale is considered indicative that the interconnects with the single alloy capping layer of the invention perform at least six times better than structures without the capping layer.

The fabrication of interconnects with the invention is generally achieved by filling with copper an electrically isolated lined opening in hardmask material surface of a preprocessed substrate, chemical-mechanical planarization of the copper and hardmask surface and electrolessly depositing the single layer alloy. The invention can involve first providing a pre processed substrate that has a copper conductor member formed in a thick layer of a dielectric that has a layer of a subsequent etching resistant hard mask material on the surface of the dielectric and surrounding the copper member, then depositing an alloy film in the range of 50 to 300 Angstroms thick on the copper. The technique of electroless deposition, including the use of a nucleation layer of Pd particles, standard in the art, is used for the deposition of the alloy.

Alternatively, following the selective deposition of the metal alloy film, the preprocessed substrate can be subjected to a temperature excursion to the Vicinity of 300 degrees C. in a reducing atmosphere for a length of time that is sufficient for a metal alloy film barrier to be formed by diffusion a few atomic layers into the copper surface. The resulting partial product at this point is a copper conductor member situated in an insulating and etch resistant layer with a metal alloy layer barrier.

The partial product at this point inparts to the copper interconnect a low dielectric constant and with good adhesion to subsequent layers and with good diffusion barrier properties; in which, further, the standard problems of voids and hillocks encountered with the type of heavy capping layer used heretofore, are avoided with this invention.

The metal alloy that produces the barrier is made up of a metal alloy of the type generally represented by A—X—Y in which the primary ingredient X is Co or Ni while X and Y are minor alloy modifiers to tailor the properties of the alloy. The ingredient X is usually a member of the group of W, Sn, and Si and the ingredient Y is usually a member of the group of P and B. An acceptable example is 86–90% wt. of Co or Ni; 1–5% wt of W and 6–12% wt of P in the film. What has been described is a copper interconnect structural interface involving a single, about 50–300 A thick, alloy capping layer, that controls diffusion and electromigration of the interconnection components and reduces the overall effective dielectric constant of the interconnect; the capping layer being surrounded by a material referred to in the art as hardmask material that can provide a resist for subsequent reactive etching operations, and there is also provided the interdependent process steps in fabrication.

What is claimed is:

1. A metallization interface in integrated circuit fabrication for use in joining a copper interconnect member to other electrical network members, comprising in combination a copper interconnect member positioned in a dielectric substrate, said copper interconnect member being surrounded by an electrically isolating liner in said substrate, said copper interconnect member surrounded by said electrically isolating liner combination being further surrounded at a surface of said dielectric substrate by a layer of a hard mask material, and, a single alloy capping layer of CoWP in the proportions 86–90% wt. of Co, 1–5% wt of W and 6–12% wt of P, 50–300 Angstroms thick in contact with the surface of said copper interconnect member at said hardmask surface.

2. A metallization interface in integrated circuit fabrication for use in joining a copper interconnect member to other electrical network members, comprising in combination a copper interconnect member positioned in a dielectric substrate, said copper interconnect member being surrounded by an electrically isolating liner in said substrate, said copper interconnect member surrounded by said electrically isolating liner combination being further surrounded at a surface of said dielectric substrate by a layer of a hard mask material, and, a single alloy capping layer of NiWP in the proportions 86–90% wt. of Ni, 1–5% wt of W and 6–12% wt of P, 50–300 Angstroms thick in contact with the surface of said copper interconnect member at said hardmask surface.

3. The process of providing a copper interconnect metallization interface in integrated circuit fabrication for use in joining a copper interconnect member to other electrical network members, comprising the steps of:

positioning in a substrate, extending to and exposed at a surface thereof, a copper interconnect member, surrounded by an electrically isolating liner in said substrate, applying a layer of a hard mask material to said surface of said substrate surrounding said isolating liner and copper interconnect member, and, applying by electroless deposition with a precurser deposition of Pd particles a capping layer over said exposed copper interconnect member, said capping layer being 50–300 Angstroms thick and having the properties of resistance to the diffusion of copper and the electromigration of copper.

4. The process of claim 3 wherein, in said step of applying a capping layer, said capping layer is an alloy of the A—X—Y type, where:

the ingredient A is a member of the group of Co and Ni, the ingredient X is a member of the group of W, Sn and Si, and, the ingredient Y is a member of the group of P and B.

5. The process of claim 4 wherein, in said step of applying a capping layer, said capping layer is an alloy taken from the group of CoWP and NiWP.

6. The process of claim 3 wherein, in said step of applying a layer of a hard mask material to said surface of said substrate, said hard mask material is a member of the group of Si3N4 and SiO2.

7. In the process of claim 3, following the step of applying said layer of hardmask material and before said step of applying said capping layer, performing the additional step of planarizing to a common surface, by a technique selected from the group of chemical and mechanical polishing, the exposed interconnect member, the surrounding liner member and said hardmask layer.

8. The process of providing a multi integration layer copper interconnect interface in integrated circuit fabrication, comprising the steps of:

first, positioning in a substrate, extending to and exposed at a surface thereon a copper interconnect member, surrounded by an electrically isolating liner in said substrate, second, applying a layer of a hard mask material to said surface of said substrate surrounding said isolating liner and copper interconnect member, third, planarizing to a common surface, by a technique selected from the group of chemical and mechanical polishing, the exposed interconnect member, the surrounding liner member and said hardmask layer, fourth, applying a capping layer over said exposed copper interconnect member, said capping layer being 50–300 Angstroms thick and having the properties of resistance to the diffusion of copper and the electromigration of copper, and repeating said first through fourth steps for each subsequent integration layer.

* * * * *